United States Patent [19]

Dance et al.

[11] 4,078,635

[45] Mar. 14, 1978

[54] CRYSTAL MOUNT SHOCK ABSORBER

[75] Inventors: William Kirk Dance, Loveland; Douglass Reed Getty, Cincinnati, both of Ohio

[73] Assignee: Harris Corporation, Cleveland, Ohio

[21] Appl. No.: 563,913

[22] Filed: Mar. 31, 1975

[51] Int. Cl.² .............................................. F16F 7/00
[52] U.S. Cl. .................................... 188/1 B; 310/321
[58] Field of Search .......................... 188/1 B; 310/8.2

[56] References Cited

U.S. PATENT DOCUMENTS

| 1,657,390 | 1/1928 | Halikman | 188/1 B |
| 2,546,321 | 3/1951 | Ruggles | 310/8.2 X |
| 2,644,904 | 7/1953 | Barry et al. | 310/8.2 |

Primary Examiner—Duane A. Reger
Attorney, Agent, or Firm—Charles C. Krawczyk

[57] ABSTRACT

A piece of flexible tubing is positioned within the cover of a crystal mount and surrounds a planar crystal without engaging the crystal or obstructing its vibration due to electrical signals applied to the crystal. The shape of the tubing is such that it resiliently engages the cover walls at a plurality of locations and provides free portions therebetween that function as cushions for limiting the movement of the crystal in response to accelerating or decelerating shock forces applied to the crystal in a direction transverse to the plane of the crystal.

9 Claims, 7 Drawing Figures

CRYSTAL MOUNT SHOCK ABSORBER

BACKGROUND OF THE INVENTION

Crystals in the form of thin planar wafers are used with all types of electrical equipment to provide a frequency standard. The crystal is cut along a predetermined crystalline axis to provide controlled movement for vibration in response to electrical signals applied to the opposite planar surfaces of the crystal.

In order to achieve desirable frequency characteristics, the crystals are sometimes made very thin but still must be an element that is not too fragile for human handling. It is also desirable that the size of the crystal wafer along the planar direction be as large as possible to reduce the internal resistance of the crystal and thereby increase its "Q". However, the size of the crystal has practical limits, to a large degree controlled by the size limitations on the entire unit. In any event, because of the thin planar shape of the crystal, it is readily susceptible to damage, particularly when subject to shock in a direction transverse the planar surface.

With integrated circuits and micro-minature circuits, the crystal unit often is the largest component in an electrical system. Hence, there has been a continual effort to reduce the size of the entire crystal unit. The crystal unit generally includes the planar crystal mounted to a base by a pair of electrodes and a cover secured to the base for encapsulating the crystal. The container is comprised of the cover and base that have a generally oval shape and that extend along the planar direction of the crystal to allow for the planar shape of the crystal. Hence, for miniaturization purposes, the size of the container has been reduced to provide less and less space between the crystal and the cover. It was found that if the crystal structure is subjected to decelerating or accelerating forces due to shock, such as being dropped, etc., the crystal tends to bang against the cover sides often resulting in permanent damage in the form of cracks.

Crystal units are often used in radio circuits, such as for example in portable two-way radios, because they provide extremely accurate frequency control. Such two-way radios are often used by the military and police forces where they are essential for proper communications. For convenience purposes, it is desirable to make the two-way radios as small as possible, and yet at the same time as rugged as possible since such two-way radios are often subjected to extremely rough handling, even to the extent of being used as weapons or tools. In the past, the crystal was generally considered as the weakest item in the two-way radio structure and often sudden shocks destroyed the crystal and essentially rendered the two-way radio inoperative, often at the time when it was needed most. Hence, it can be seen that there is a necessity for the miniturization of crystal structures and yet a need to improve the ruggedness of the structure.

Various solutions were attempted in the prior art to minimize the effect of such shocks on the crystal. One unsuccessful method was to apply a plastic coating to the inner surface of the cover. Although such coating may have helped, the cover still functioned as a solid, non-resilient, barrier against which crystals banged, when subjected to shock, often destroying the unit. To provide a resilient cushion, a strip of plastic was placed between the container and the crystal that surrounded the crystal. However, this approach was found to be troublesome, since the strip of plastic tended to shift within the container and often abutted against the crystal interfering with its proper operation. The crystal is also often subjected to extremes in operating temperatures. The plastic strip of the prior art tended to expand and contract with temperature changes, and at times, the loose ends of the plastic strip would curl, or move, to engage the crystal and prevent its free movement and vibration.

It is very important that the crystal is continuously free to vibrate without interference when subjected to electrical signals so that the crystal can provide an accurate frequency standard. Care must also be taken to assure that the crystal is not contaminated by deposits due to time, temperature, and use. The thickness of the electrodes is placed upon the opposite planar surfaces of the crystal and are accurately controlled so that the crystal is tuned to the correct frequency of operation. These electrodes are generally deposited by vacuum deposition techniques. Generally, the final step in the deposition technique includes a frequency detection circuit which stops the deposition procedure when the crystal plus the electrodes are tuned to the correct frequency. The crystal is mounted into the container and the container is filled with an inert gas and sealed off so that no further depositions will form on the crystal and the electrode structure. If added materials or structures are to be included within the container to act, such as for example as shock absorbers, care should be taken in the selection of the material so that the material will not "outgas" depositions on the crystal over the expected range of operating temperatures. The outgassed depositions tend to change to frequency characteristics with time, particularly when subjected to higher temperatures.

It is therefore an object of this invention, to provide a new and improved shock absorber for crystal units.

It is also an object of this invention to provide a new and improved shock absorber for crystal units that does not interfere with the operation of the crystal over wide temperature ranges.

It is a further object of this invention to provide a new and improve shock absorber for crystal units that does not move within the crystal container, nor abuts against the crystal under normal operation.

It is still a further object of this invention to provide a new and improved shock absorber for crystal units that does not change in shape with variations in temperature to the extent of engaging the crystal.

It is an object of this invention to provide a new and improved shock absorber for crystal units that does not outgas over the expected operating temperature range of the crystal unit.

It is also an object of this invention to provide a new and improved shock absorber for crystal units that is inexpensive and easily assembled.

BRIEF DESCRIPTION OF THE INVENTION

A shock absorber for a planar shaped crystal element that is connected to a base by electrodes and is encapsulated by a cover comprises an elongated piece of flexible tubing that is positioned between the cover and the crystal and surrounds the crystal with a spacing in between so that the crystal is free to vibrate when electrical signals are applied thereto. The flexible tubing has a shape that it continuously urges against the inner walls of the cover at a plurality of locations to maintain its position, while the free portions of the shock absorber therebetween function as cushions to limit the movement of the crystal when subjected to acceleration and deceleration forces due to physical shocks, etc.

Because of the planar shape of the crystal, the base and the cover generally have an oval shape to reduce the size of the unit. The shape of the flexible tubing when placed in the cover takes the form of an ellipsoid, wherein the tubing engages the cover at least along the minor axis of the ellipse shaped cross section. Depending upon the size of the tubing relative to the cover, the tubing can also engage the cover along the major axis. The portions of the tubing between the minor and the major axis form the cushions to limit the movement of the crystal. Hence, when the crystal is subject to accelerating or decelerating forces due to shock, etc., the movement of the crystal engages the free portions of the shock absorber providing a cushion effect, limiting its movement and preventing its destruction.

As a further feature of the invention, the portion of the crystal tubing along the major axis can be cut away to provide an aperture. The aperture assures that, in the event the tubing shrinks due to temperature changes, the tubing will not engage the ends of the crystal or the electrodes and will not interfere with its operation.

The fact that the tubing is continuous in shape (with or without aperture) and resiliently urges against the cover assures that the tubing will be continuously held in place and will maintain its shape with temperature, and will not engage the crystal. The use of the tubing proves to be a cheap and inexpensive shock absorber, that can be readily assembled and provide a continuous long lasting use. It has been found that the tubing made out of Teflon has a composition that does not outgas over the expected range of temperatures and therefore will no provide any noticable affect on the operating characteristics of the crystal.

DETAILED DESCRIPTION OF THE INVENTION

Figure 3:
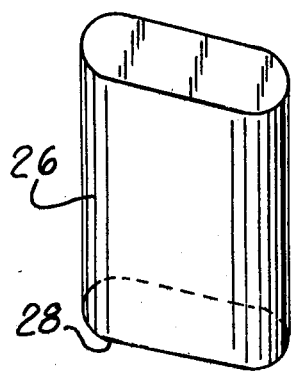
FIG. 3 is a top view of the shock absorber of FIG. 2.
Figure 3:
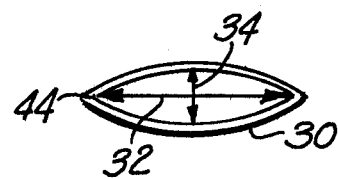

A conventional crystal unit includes an oval shaped base 10 having an insulated inner portion 12 through which a pair of relatively rigid electrodes 14 extend. A crystal 16, in the form of a thin wafer disc, includes a pair of electrodes 18 and leads 20 mounted or deposited on opposite planes of the crystal disc. The crystal disc 16 is connected to the electrodes 14 by a pair of resilient conductors 22, generally referred to as piano wire. The wires 22 are soldered to the electrodes 14, and include a clip 24 at the opposite end that makes contact with separate ones of the leads 20. The crystal disc 16 is encapsulated by an oval shaped cover 26 which is soldered to the base 10 at the end 28. the cover 26 is formed with a hole (not shown) through which an inert gas is inserted and the hole sealed thereby providing a controlled atmosphere.

The crystal disc 16 comprises a very thin piece of quartz, in the order of 0.002 to 0.075 inches thick, depending upon its desired frequency characteristics. The diameter of the crystal disc 16 is in the range of 0.24 to 0.255 inches. The crystal disc 16 is cut from a large crystalline structure along a preset crystalline axis and then is subsequently ground and polished to the desired thickness. The electrodes 18 and the leads 20 are initially vacuum deposited to a desired thickness. The crystal disc 16 is then fine tuned to the desired frequency of operation by further deposition of material on the electrodes 18, so that, in response to electrical signal applied to the electrodes, the crystal resonantes at a preset frequency. Generally, the second deposition step includes a detection circuit that measures the frequency response of the crystal, and when the crystal reaches the proper frequency of operation is then cuts off further deposition. Hence, the crystal when ready for mounting, is a relatively expensive element that is precision manufactured, and is also a very fragile structure requiring great care in assembling.

The electrical connections to the crystal 16 is made by the clips 24 on the wires 22. The use of the piano wire 22 and the clip 24 provide a flexible mount that provides a minimum amount of interference with the oscillatory movement of the crystal.

Although the crystal is illustrated in the form of a disc, it should be understood that it can be of any shape, or form, such as for example, square, octagonal, etc. The thickness of the crystal depends upon the frequency characteristics desired. The diameter of the crystal disc depends upon the desired electrical resistance. The crystal disc 16, when excited by electrical signals, will generate stresses in the crystal structure along the plane of the crystal and cause the crystal to vibrate. When the crystal is included in an oscillator circuit having a frequency of oscillation approaching that of the crystal, the crystal functions to control the frequency of oscillation and thereby provide a highly accurate standard for maintaining the frequency of oscillation constant and at a present frequency determined by the resonant frequency of the crystal. In affect, the crystal, when operating in conjunction with with an oscillator circuit, can be considered an R-L-C tank circuit, when operating at the resonant frequency, causes the L and the C components to cancel providing primarily a resistive impedance. In order to increase the "Q" of the tank circuit, the resistance is reduced by increasing the diameter of the crystal as large as possible, taking into consideration practical limitations. The dampening is also reduced by minimizing the rigidity of the wires 22. Hence, it can be seen, that the crystal disc 16 is an extremely fragile device, accurately manufactured to close tolerances and specifications and is generally mounted in a resilient manner for proper performance.

However, with miniturization of electrical equipment, there is a continuous need to reduce the size of the container and still provide the same degree or improved performance. As the container is reduced, the spacing between the container cover 26 and crystal disc 16 is reduced. This compounds problems concerning the ruggedness of the crystal unit. For example, crystal units are often included as part of the oscillator circuits in two-way portable radios to provide frequency standards for communications. The two-way radios are often used as portable devices by police and the military. At times the two-way radios has been used as a weapon to subdue an adversary, and also as a tool, such as to break windows, etc., in emergencies. Historically, the crystal unit generally has been the weakest link in the two-way radio. This is because when the radio is subjected to a shock by dropping, or banging against an object, etc., the accelerating or decelerating forces applied to the crystal disc 16 of the prior art tend to bend the wires 22 and cause the crystal disc 16 to bang against the inner wall of the cover 26. If the shock is of sufficient magnitude, damage often occurs to the crystal disc 16 in the form of a crack, whereby the crystal disc is rendered defective and the two-way radio inoperative, often when it is most needed.

Figure 7:
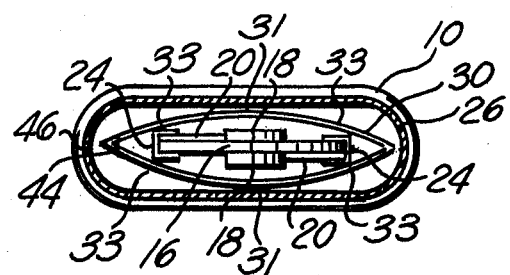
FIG. 7, is a top view of the crystal unit of FIG. 5 with the top of the cover cut away to illustrate the spacing between the shock absorber and the crystal, and also the manner in which the shock absorber fits within the cover in accordance with one embodiment of the invention.

In accordance with the invention, a shock absorber is provided for the crystal unit that reduces the effect of shock, effectively improving the ruggedness of the crystal unit so that the crystal unit need not be the weakest physical link in any particular electronic circuit. The shock absorber of the invention comprises a piece of flexible plastic tubing 30. The tubing 30 is generally round in shape and is prestressed by passing through rollers to flatten and take the form of an ellipsoid as illustrated in FIGS. 1, 2, 3 and 4, having a major axis 32 and a minor axis 34. The minor axis 34 of the tubing 30 is selected to be larger than the spacing between the inner side walls of the cover 26, and the major axis 32 less than the distance between the inner ends of the cover 26. The length of the tubing 30 is selected to be slightly less than the height of the cover 26. When the shock absorber of the invention is assembled in the crystal unit, the flexible tubing 30 is inserted into the cover 26 and then the cover, with the tubing, placed over the crystal disc 16 and secured to the base 10. As illustrated in FIG. 7, the portion 31 of the flexible tubing 30 adjacent the minor axis 34 engage the inner side walls of the cover 26 and the flexible tubing is held in place by the resilient force of the tubing attempting to expand to its original shape prior to prestressing. Although the tubing 30 is illustrated in FIG. 7 as only engaging the inner walls of the cover 26 at points adjacent to the minor axis 34, it should be understood, that depending upon the size of the cover and the size of the tubing 30 being used, the tubing could also engage the cover 26 adjacent to the major axis 32.

Figure 5:
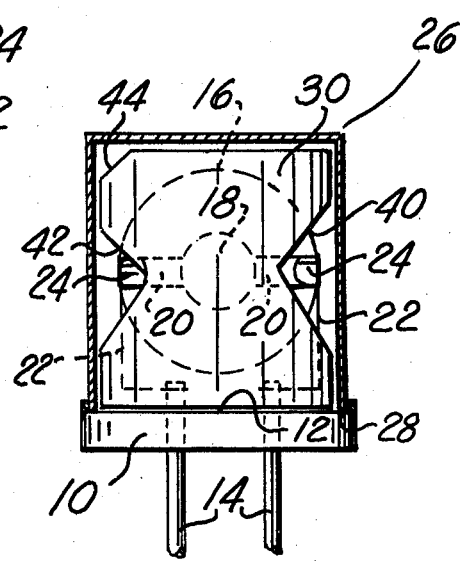
FIG. 5 is a side view of a crystal unit with a portion of the cover cut away to illustrate the position of the shock absorber relative to the crystal.
Figure 6:
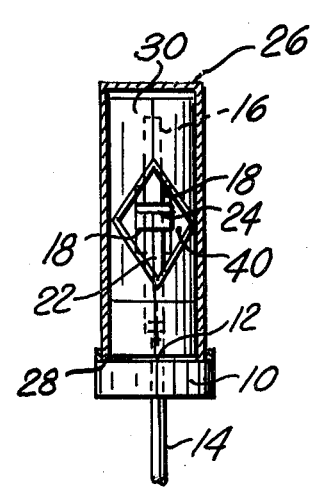
FIG. 6 is an end view of the crystal unit of FIG. 5 with the side end of the cover cut away.

As illustrated in FIGS. 5 and 7, the tubing 30 surrounds the crystal disc 16 with a spacing in between. No part of the tubing 30 abuts against either the crystal disc 16 or the wires 22, or the clip 24, thereby providing the required degree of freedom for the crystal disc 16 to vibrate. The portions 33 of the tubing 30 between the points at which the tubing 30 engages the cover 26 provide the function of the shock absorber by limiting the amount of movement of the crystal disc 16 and also providing a cushion for reducing the effects of acceleration and deceleration. As illustrated in FIGS. 6 and 7, if the crystal disk 16 is subjected to a shock in a direction transverse the plane of the crystal disc, the crystal will pivot about a pin on the wires 22 causing the crystal to move towards the cover 26.

However, in accordance with the shock absorber of the invention, the crystal disc 16 will first engage the portion 33 or two portions 33 of the tubing 30 between the major and minor axis 32 and 34, which are highly flexible and will provide a cushioning effect on the movement of the crystal disc 16. This cushioning effect will be provided even though the major axis 32 may be abutting against the cover 26 ends as previously mentioned above. With this type of tubing 30, it has been found that the crystal disc 16 can stand between three to four times the amount of shock as the crystal disc of the prior art without damage, thereby providing a much more rugged crystal element, even to the point as no longer being considered the weakest link in portable communication device.

Figure 4:
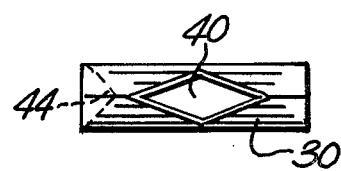
FIG. 4 is an end view of the shock absorber of FIG. 2.
Figure 2:
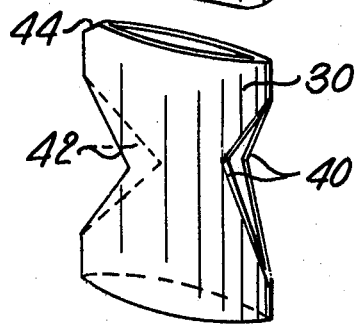
FIG. 2 is a side view of the shock absorber of FIG. 1.
Figure 2:
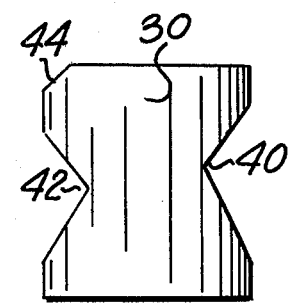
Figure 1:
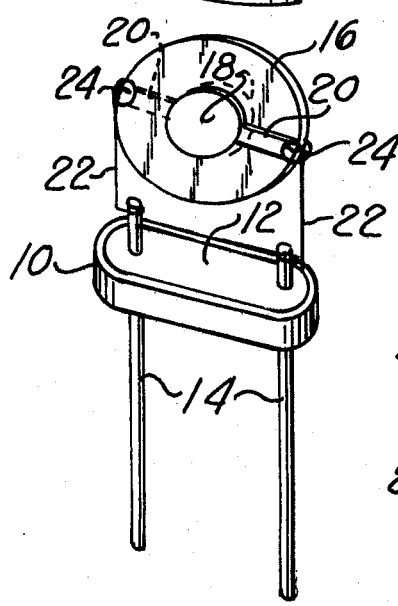
FIG. 1 is an exploded view of a crystal unit including the shock absorber of the invention.

Depending upon the size of the cover 26 and the diameter of the crystal disc 16, it has been found that if sufficient clearance is available between the ends of the crystal disc 16 and the tubing 30, the tubing 30 can be continuous. However, if the spacing between the ends of the crystal disk 16 and the clips 24 is limited, such as in the case of maximum diameter of crystal disc 16 within a minimum cover size, the solid tubing 30 may present some problems under low temperature operating conditions. As previously mentioned above, the tubing 30 is continuously resiliently urging against the inner walls of the cover 26 at a plurality of locations, two locations in the case of contact at the minor axis of 34 only, and four locations in the case of contact in both the major and minor axis 32 and 34. The resilient expansion forces of the tubing 30 along the minor and /or major axis maintain the tubing 30 in place over a large range of variations of shock, temperature ranges, vibration, etc. However, under low temperature operation, the tubing 30 tends to shrink. If the fit between the ends of the crystal disc 16 and the major axis 32 of the tubing 30 is close, cold temperatures may cause the tubing to contract a sufficient degree to possibly cause the ends of the crystal disc 16 to engage the tubing 30, possibly causing interference with the proper operation of the crystal disc 16. To avoid this potential situation, the tubing 30 is illustrated in FIGS. 2, 3 and 4 as being formed with a plurality of apertures, or cut-aways, in the form of notches at the locations to be positioned to the ends of the crystal disc 16 at which the clips 24 make contact to provide clearance between the crystal disc 16 and the tubing 30 for any expected range of low temperature operation. For example, with a tight fit between the crystal disc 16 and the cover 26, tubing 30 with the notches 40 and 42 exhibited successful operation with temperatures of minus thirty degrees centigrade.

The cover 26 is formed with an opening 46 in the left side as viewed in FIG. 7 to provide for the insertion of an inert gas, such as nitrogen, after the assembly of the unit, and which is sealed off once the assembly has been completed. A notch 44 has been formed in the upper left-hand corner of the tubing 30 as viewed in FIGS. 2 and 5 to provide for the flow of the inert gas and the subsequent sealing of the cover 26.

To prevent the undesirable deposition of materials on the crystal disc 16 and the electrodes 18 and 20 during high temperature operation, it is desirable that the tubing 30 be formed of material that exhibits very little, if any, outgassing properties over the expected range of operating temperatures. By "outgassing", we mean the vaporization of material from the tubing 30 under high temperature of operation that may subsequently deposit on the crystal and interfere with its operation. It has been found that plastic, such as Teflon, will successfuly operate for long periods of time at 60° centigrade without materially affecting the operating characteristics of the crystal.

Hence, as indicated above, the shock absorber of the invention functions to improve the ruggedness of the crystal unit by at least a factor of two or four times, to the point that the crystal structure may not be considered as the weakest element in many types of portable electrical equipment. The shock absorber of the invention is a very inexpensive item that can be easily assembled. The tubing 30 can be made of any standard Teflon type tubing of commercially available dimensions. With the use of the tubing 30 formed with the notches 40 and 42, the thickness tolerance of the tubing and the problems associated with shrinkage of the tubing due to low temperatures is essentially eliminated. The processing and assembly costs of the shock absorber is essentially minimal. A round plastic tubing is merely crimped between a pair of rollers to be prestressed as illustrated in the Figures and cut to the desired length thereafter. If the notches 40 and 42 are to be included, they can be cut prior to, or after, the tubing 30 is cut to size. The tubing 30 is assembled in the crystal structure by simply slipping the tubing into the open end of the cover 26. The resiliency of the tubing tends to urge against the inner covered walls as it expands to attempt to achieve its original circular shape and thereby holds the tubing in place. The cover 26 with the tubing 30 is now slipped over the crystal disc 16 and the unit is sealed. The free portions 33 of the tubing 30 between the points at which the tubing engages the cover 26 function to limit the movement of the crystal disc 16 when subjected to shock, and also function as a cushion to soften the affects of the shock. The shape of the tubing 30 relative to the crystal disc 16 also provides sufficient spacing inbetween to prevent any interference with the operation of the crystal.

We claim:

1. A shock absorber for a planar crystal connected by electrodes to a base, and including a cover secured to the base encapsulating the crystal the shock absorber comprising:
a flexible tubing positioned between said cover and said crystal, surrounding said crystal with spacing in between so that said crystal is free to vibrate in response to electrical signals applied thereto, the shape of the flexible tubing being such that it urges against the inner walls of the cover at a plurality of locations and provides portions therebetween that function as cushions to limit the movement of the crystal in a direction transverse to the plane of the crystal, the cross-sectional shape of said flexible tubing in a direction normal to the axis of the tubing being in the form of an ellipse with the major axis extending along the planar surface of the crystal.

2. A shock absorber as defined in claim 1 wherein:
said flexible tubing engages said cover along the minor axis of the ellipse with the portion between the major and minor axis functioning as said cushions.

3. A shock absorber as defined in claim 2 wherein:
said flexible tubing is formed with apertures along the opposite ends defined by the major axis.

4. A shock absorber for a planar crystal having electrodes secured to opposite planar surfaces and mounted to a substantially oval base through a pair of electrodes connected to the electrodes on said crystal and including a cover having a substantially oval shape secured to said base for encapsulating said crystal, said shock absorber comprising:
an elongated flexible tubing having a substantially ellipsoid shape, said tubing being positioned in said cover so that said tubing resiliently urges against the inner sides of the cover at a plurality of locations and surrounds the crystal so that the major axis of the ellipsoid lies along the plane of the crystal and with spacing between the crystal and the tubing so that the crystal is free to move in response to electrical signals applied to the electrodes, the portions of the tubing between said locations are free to act as cushions to limit the movement of the crystal in response to acceleration and deceleration forces applied to the crystal in a direction transverse the plane of the crystal, and the tubular sides of the tubing adjacent the major axis of the ellipsoid are formed with apertures to avoid contact with said pair of electrodes.

5. A shock absorber as defined in claim 4 wherein:
said tubing is prestressed so that said tubing provides an expanding force against the inner sides of said cover along the minor axis of the ellipsoid.

6. A shock absorber for a planar crystal connected by electrodes to a base, and including a cover secured to the base encapsulating the crystal, the shock absorber comprising:
a flexible tubing initially of a shape such that it has a cross-sectional dimension larger than a cross-sectional dimension of the interior of said cover and being deformed from its initial shape so as to be insertable into said cover, and being inserted into said cover so as to surround said crystal, with prestressing created by the deforming of said tubing causing said tubing to be urged into contact with the inner side walls of said cover which face the planar surfaces of said crystal, said tubing being spaced apart from said crystal so that said crystal is free to vibrate in response to electrical signals applied thereto, and portions of said flexible tubing not urged into contact with the interior side walls of said cover cushioning and limiting the movement of said crystal in a direction transverse to the plane of the crystal.

7. A shock absorber as defined in claim 6, wherein the cross-sectional shape of said flexible tubing in its inserted position within said cover, in a direction normal to the axis of the tubing, is in the form of an ellipse with the major axis of the ellipse extending along the planar surface of the crystal.

8. A shock absorber as defined in claim 7, wherein said flexible tubing engages said cover along the minor axis of the ellipse with the portion between the major and minor axis functioning as said cushions.

9. A shock absorber as defined in claim 8, wherein said flexible tubing is provided with apertures along the opposite ends defined by the major axis thereof, through which apertures edges of said crystal extend while remaining spaced apart from the flexible tubing itself.

* * * * *